US011237932B2

(12) United States Patent
Furihata et al.

(10) Patent No.: US 11,237,932 B2
(45) Date of Patent: Feb. 1, 2022

(54) TEST INFORMATION MANAGEMENT DEVICE, TEST INFORMATION MANAGEMENT METHOD, AND NON-TRANSITORY COMPUTER READABLE STORAGE MEDIUM

(71) Applicant: YOKOGAWA ELECTRIC CORPORATION, Musashino (JP)

(72) Inventors: Ryouhei Furihata, Tokyo (JP); Yusuke Yokota, Tokyo (JP)

(73) Assignee: YOKOGAWA ELECTRIC CORPORATION, Musashino (JP)

( * ) Notice: Subject to any disclaimer, the term of this patent is extended or adjusted under 35 U.S.C. 154(b) by 318 days.

(21) Appl. No.: 16/429,318

(22) Filed: Jun. 3, 2019

(65) Prior Publication Data

US 2019/0384685 A1 Dec. 19, 2019

(30) Foreign Application Priority Data

Jun. 14, 2018 (JP) .............................. JP2018-113629

(51) Int. Cl.
*G06F 11/273* (2006.01)
*G06F 11/263* (2006.01)
*G06F 11/277* (2006.01)
*G05B 23/02* (2006.01)
*G01R 31/00* (2006.01)
*G01R 31/28* (2006.01)

(52) U.S. Cl.
CPC .......... *G06F 11/2733* (2013.01); *G01R 31/00* (2013.01); *G01R 31/2894* (2013.01); *G05B 23/02* (2013.01); *G06F 11/263* (2013.01); *G06F 11/277* (2013.01); *G01R 31/001* (2013.01); *G05B 2219/24065* (2013.01); *G05B 2219/31316* (2013.01)

(58) Field of Classification Search
CPC .. G06F 11/2733; G06F 11/263; G06F 11/277; G01R 31/00; G01R 31/2894; G01R 31/001; G05B 23/02; G05B 2219/31316; G05B 2219/24065; G05B 19/042; G05B 23/0221
USPC .................................................... 324/750.15
See application file for complete search history.

(56) References Cited

U.S. PATENT DOCUMENTS

2015/0199831 A1* 7/2015 Konishi ............. G05B 23/0272
345/440
2017/0293544 A1* 10/2017 Katayama .......... G05B 19/4184

FOREIGN PATENT DOCUMENTS

| GB | 2507350 A | 4/2014 |
| JP | 3035916 U | 1/1997 |
| JP | 9-81233 A | 3/1997 |

(Continued)

*Primary Examiner* — Farhana A Hoque
(74) *Attorney, Agent, or Firm* — Sughrue Mion, PLLC

(57) ABSTRACT

A test information management device manages test information relating to a test carried out by receiving a test signal output from a first device in a second device. The test information management device includes a linker configured to link together first information including information representing an output state of the test signal in the first device and second information including image information representing reception results of the test signal in the second device using at least one of identification information for identifying the first device or the second device and times at which the first information and the second information are generated.

12 Claims, 10 Drawing Sheets

(56) References Cited

FOREIGN PATENT DOCUMENTS

| JP | 2015133015 A | 7/2015 |
| JP | 2017-191386 A | 10/2017 |

\* cited by examiner

TEST INFORMATION MANAGEMENT DEVICE, TEST INFORMATION MANAGEMENT METHOD, AND NON-TRANSITORY COMPUTER READABLE STORAGE MEDIUM

BACKGROUND

Technical Fields

The present invention relates to a test information management device, a test information management method, a test information management program, and a non-transitory computer readable storage medium.

Priority is claimed on Japanese Patent Application No. 2018-113629, filed Jun. 14, 2018, the contents of which are incorporated herein by reference.

Related Art

Conventionally, in a plant, a factory, or the like (hereinafter referred to as "plant"), a distributed control system (DCS) is built, and a highly automated operation is implemented. This distributed control system is a control system in which some controllers for controlling field devices (a measuring device and an operation device) are distributed to respective control loops. In a plant in which such a distributed control system is built, a field device is regularly or irregularly maintained by a worker in order to prevent an abnormal operation, retain measurement accuracy, and the like.

In many cases, a field device is maintained by using a device maintenance apparatus capable of wired communication or wireless communication with the field device. This device maintenance apparatus is, for example, a note type or tablet type computer, a personal digital assistant (PDA), a handheld terminal (HHT), a smart phone, or the like on which a dedicated program for maintaining a field device is installed. Such a device maintenance apparatus is used to perform various maintenance tasks, such as a checking task of reading and checking device information set or the like in the field device to be maintained and a setting task of setting new device information for the field device to be maintained, according to the field device to be maintained.

In the case of maintaining a field device, various tests (examinations) of the field device to be maintained are also carried out. In one of such tests, a field device is caused to generate a simulation signal according to a test pattern created in advance. This test is represented by a loop test (a loop examination). In the loop test, a control system of a plant or the like causes the field device to output a simulation signal of a certain output level (a test output level) to an upper device or the like, such as a DCS, and checks operation of the field device and whether the field device and the upper device or the like are connected correctly. Japanese Unexamined Patent Application Publication No. 2017-191386 discloses a device maintenance apparatus capable of performing such a loop test.

The above test in which a field device to be maintained is used may be carried out by a plurality of persons. For example, in many cases, a test represented by the loop test in which the field device is caused to generate a simulation signal is carried out by cooperation between a field worker who carries out a maintenance work and an operator who monitors a plant. Specifically, the field worker issues a simulation signal generation instruction to the field device, and the plant operator checks a simulation signal received from an upper device or the like.

Conventionally, information relating to a test in which a field device to be maintained is used (including test results) is separately managed according to work content. For example, in a test represented by the above-described loop test, work content of a field worker is recorded and managed in the aforementioned device maintenance apparatus, and work content (check results) of a plant operator is recorded and managed, for example, in a document.

As described above, conventionally, information relating to a test and including test results is not integrally managed, and there is no means for integrally managing the information. Accordingly, there is a problem in that it is difficult to ensure the reliability of a test.

SUMMARY

In order to solve the aforementioned problem, a test information management device according to an aspect of the present invention is a test information management device (30 or 60) which manages test information relating to a test carried out by receiving a test signal output from a first device (11a or 13 and 14) in a second device (13, 14, 50, or 11b), and the test information management device may include a linker (34b) which links together first information (IF1 or IF4) including information representing an output state of the test signal in the first device and second information (IF2 or IF3) including image information representing reception results of the test signal in the second device using at least one of identification information for identifying the first device or the second device and times at which the first information and the second information are generated.

Further features and aspects of the present disclosure will become apparent from the following detailed description of exemplary embodiments with reference to the attached drawings.

DETAILED DESCRIPTION OF THE EMBODIMENTS

Figure 1:
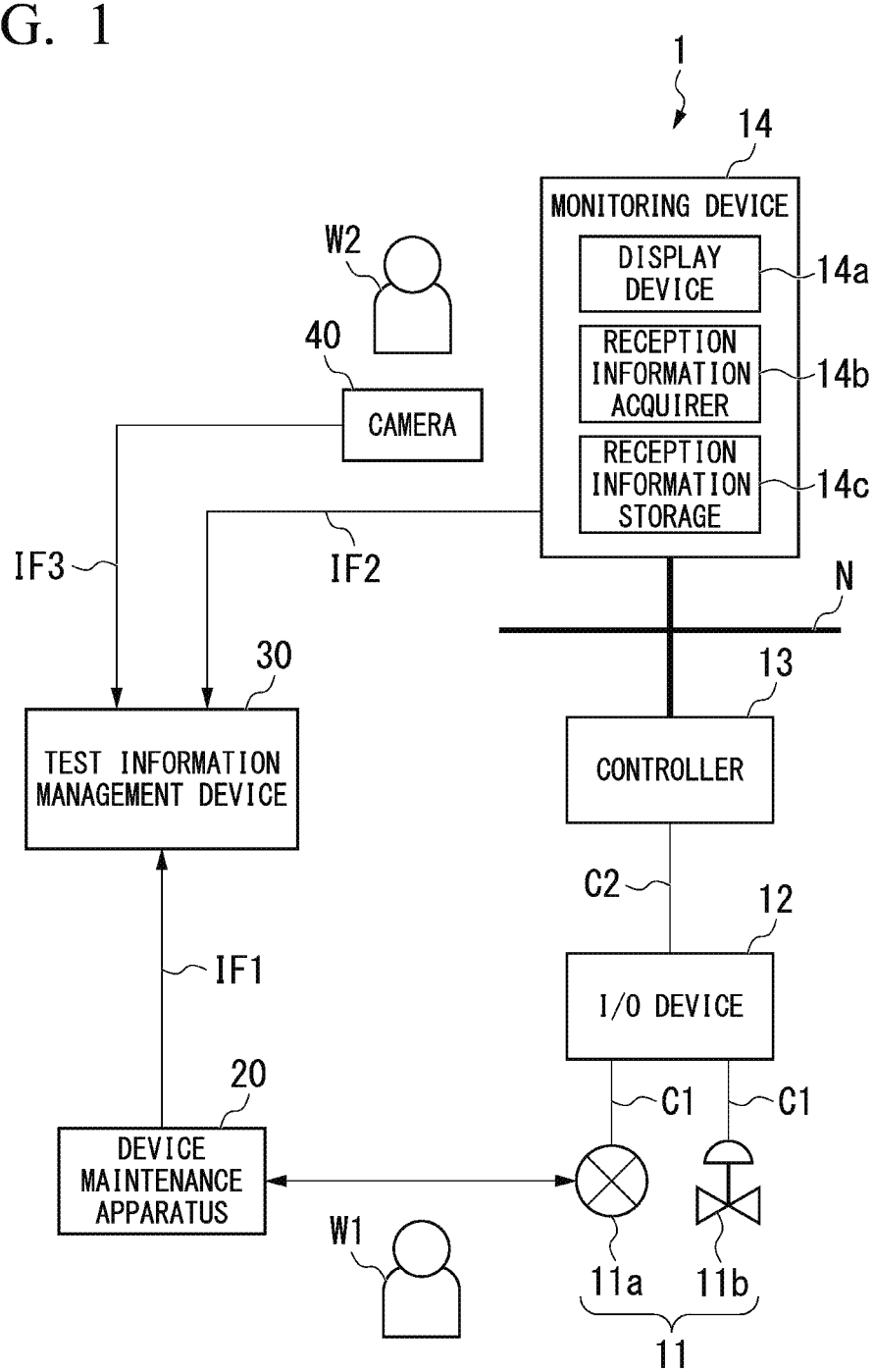
FIG. 1 is a block diagram showing a main constitution of a test information management system according to a first embodiment of the present invention.

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide a test information management device, a test information management method, and a non-transitory computer readable storage medium capable of ensuring the reliability of a test carried out using the field device.

Hereinafter, a test information management device, a test information management method, a test information management program, and a storage medium according to embodiments of the present invention will be described with reference to the drawings. First, an overview of these embodiments will be described below, and then each embodiment will be described in detail.

[Overview]

Embodiments of the present invention make it possible to ensure the reliability of a test carried out using a field device. Specifically, in a test (an examination) represented by the above-described loop test and carried out by receiving a test signal (an examination signal) output from a first device in a second device, first information including information representing an output state of the test signal in the first device and second information including image information representing reception results of the test signal in the second device are integrally managed by automatically linking the first information and the second information together, and thereby the reliability of the test carried out using a field device is ensured. For example, the traceability of a test can be easily achieved by integrative management, and thus it is possible to ensure the reliability of the test.

An example of a sequence of the conventional loop test carried out by a plurality of workers (a worker A and a worker B) is as follows.

<Task Preparation>

The worker A moves to the installation location of a field device which is a test target (the first device)

The worker B waits at the installation location of a monitoring device which receives a test signal (the second device)

The worker A and the worker B prepare to communicate with each other with communication devices such as transceivers <Task>

(A) The worker A notifies the worker B of the start of a task using the communication device (B) The worker A connects a device maintenance apparatus to the field device and confirms that the field device is a target device (C) The worker A operates the device maintenance apparatus so that a test signal is output from the field device (D) The worker B checks reception results of the test signal with reference to content displayed by the monitoring device (E) The worker B determines whether the reception results of the test signal are acceptable or not (F) The worker B records the determination result on paper or the like (G) The worker B notifies the worker A of continuation or the end of the task using the communication device Since a conventional loop test partially depends on operations and judgments of individual workers, a mistake may be made. For example, the following mistakes may be made.

(B): A mistake may be made in selecting the target device by a misjudgment of the worker A (C): A mistake may be made in generating the test signal by a misoperation of the worker A (D): A checking mistake may be made by a misjudgment of the worker B (E): A misjudgment may be made by a misjudgment of the worker B (F): A recording mistake may be made by the worker B As described above, a conventional loop test partially depends on operations and judgments of individual workers, and therefore mistakes may be made. Therefore, it is difficult to ensure the reliability of a test carried out using a field device. In these embodiments, first information including information representing an output state of a test signal in a first device and second information including image information representing reception results of a test signal in a second device are integrally managed by automatically linking the first information and the second information with at least one of identification information for identifying the first device or the second device and the times at which the first information and the second information are generated, such that the reliability of the test carried out using a field device may be ensured.

First Embodiment

<Test Information Management System>

FIG. 1 is a block diagram showing a main constitution of a test information management system according to a first embodiment of the present invention. As shown in FIG. 1, the test information management system according to the present embodiment is used in a process control system 1. For this reason, the process control system 1 is described first. The process control system 1 includes a field device 11 (a first device), an input/output (I/O) device 12, a controller 13 (a second device), and a monitoring device 14 (a second device) and controls an industrial process implemented in a plant (not shown in the drawing) by the controller 13 controlling the field device 11 according to an instruction or the like from the monitoring device 14.

The plant in which such a process control system 1 is built may be a plant for managing and controlling a well site, such as a gas field or an oil field, and surroundings thereof, a plant for managing and controlling electric power generation, such as hydroelectric power, thermal power, or nuclear power, a plant for managing and controlling an environmental power generation, such as solar power or wind power, a plant for managing and controlling water supply and sewerage or a dam, or the like instead of an industrial plant such as a chemical plant. Also, these plants are only examples, and it is to be noted that the plant in which the process control system 1 is built is not limited to these plants.

The field device 11 and the I/O device 12 are connected by transmission lines C1, and the I/O device 12 and the controller 13 are connected by a cable C2. Also, the controller 13 and the monitoring device 14 are connected to a control network N. For example, the control network N is a network connecting a plant site and a monitoring room.

The field device 11 is, for example, a sensor device, such as a flowmeter and a temperature sensor, a valve device, such as a flow control valve and an on-off valve, an actuator device, such as a fan and a motor, and other devices installed in a plant site. To facilitate understanding, FIG. 1 shows one sensor device 11a for measuring a flow rate of a fluid and one valve device 11b for controlling (manipulating) a flow rate of a fluid among a plurality of the field devices 11 installed in a plant.

The I/O device 12 is provided between the field device 11 and the controller 13. The I/O device 12 includes a plurality of I/O channels (not shown in the drawing) to which the field device 11 is connected and processes signals input and output between the field device 11 connected to the respective I/O channels and the controller 13. For example, the I/O device 12 converts a signal that can be obtained from the field device 11 into a signal that can be received by the controller 13. The I/O device 12 can also be referred to as a relay device which connects the plurality of the field devices 11 to the controller 13 and relays a signal input or output by the field device 11 and a signal input or output by the controller 13.

The controller 13 controls the field device 11 by communicating with the field device 11 according to an instruction or the like from the monitoring device 14. Specifically, the controller 13 acquires a process value measured by a piece of the field device 11 (for example, the sensor device 11a) and calculates and transmits an operation amount of another piece of the field device 11 (for example, the valve device 11b), thereby controlling the other piece of the field device 11 (for example, the valve device 11b).

The monitoring device 14 is, for example, a terminal device which is operated by an operator W2 of the plant and used to monitor a process. The monitoring device 14 includes a display device 14a and notifies the operator W2 of actions of the field device 11 and the controller 13 constituting the process control system 1 by acquiring input or output signals of the field device 11 from the controller 13 and displaying the input or output signals on the display device 14a. Also, the monitoring device 14 controls the controller 13 on the basis of an instruction of the operator W2.

The monitoring device 14 includes a reception information acquirer 14b and acquires image information showing reception results of a signal (for example, a test signal of a loop test: a simulation signal) transmitted from the field device 11 and received by the controller 13. Specifically, the reception information acquirer 14b acquires image information (a so-called screenshot) of all or some of content displayed by the display device 14a and stores the acquired image information in a file. This file is associated with metadata (a file name, a file creation date, and the like). In this way, information (reception information IF2: second information) including the image information showing the reception result of the signal received by the controller 13 is generated. The timing (the time at which the reception information IF2 is generated) at which the reception information acquirer 14b acquires the image information is, for example, the timing at which a test signal is received, the timing at which a test signal value is changed, the timing at which a preset period arrives (automatic), or an arbitrary timing (manual).

During a loop test, for example, a tag name of a piece of the field device 11 used in the loop test, a value (a pressure or flow rate value) received in the loop test, a graph showing a change of the received value over time, and the like are displayed in the display device 14a of the monitoring device 14. To this end, image information including this information is acquired by the reception information acquirer 14b. The monitoring device 14 includes a reception information storage 14c and stores the reception information IF2 acquired by the reception information acquirer 14b in the reception information storage 14c. Also, when there is a request from an external device (for example, a test information management device 30), the monitoring device 14 outputs the reception information IF2 stored in the reception information storage 14c to the outside.

In a plant in which such a process control system 1 is built, a device maintenance apparatus 20 is used to maintain the field device 11 and the like. Also, the test information management device 30 is used to manage results of a loop test carried out in the case of maintaining the field device 11 and the like. In order to manage the results of the loop test, a camera 40 may also be used. A test information management system according to the present embodiment is composed of the monitoring device 14 in addition to the device maintenance apparatus 20 and the test information management device 30 (as well as the camera 40). The device maintenance apparatus 20, the test information management device 30, and the camera 40 will be described below in sequence.

<Device Maintenance Apparatus>

Figure 2:
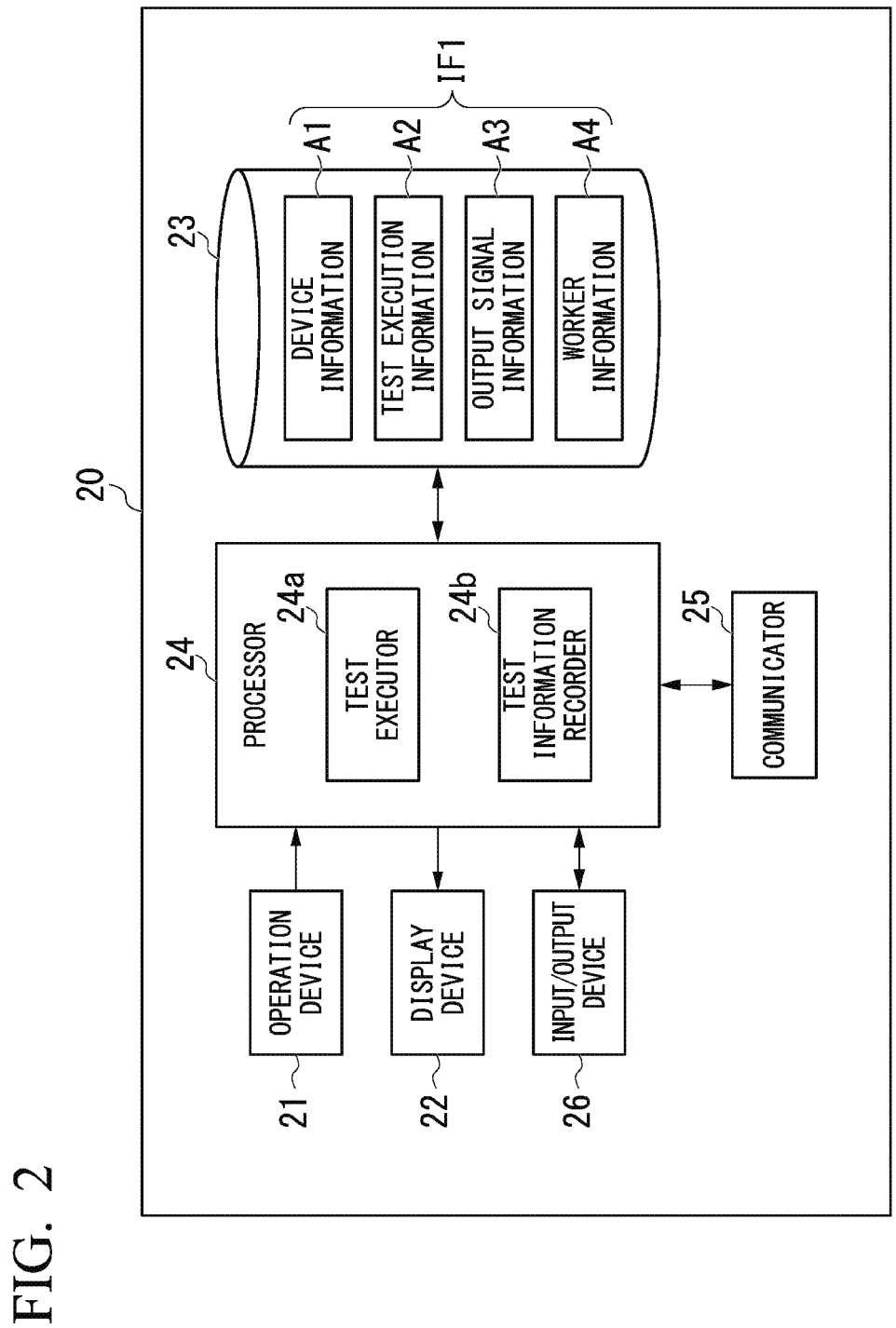
FIG. 2 is a block diagram showing a main constitution of a device maintenance apparatus used in the first embodiment of the present invention.

FIG. 2 is a block diagram showing a main constitution of a device maintenance apparatus used in the first embodiment of the present invention. As shown in FIG. 2, such a device maintenance apparatus 20 includes an operation device 21, a display device 22, a storage 23, a processor 24, a communicator 25, and an input/output device 26. Such a device maintenance apparatus 20 is implemented by, for example, a note type or tablet type computer or the like. Functions of the device maintenance apparatus 20 (functions for maintaining or testing the field device 11) are implemented in a software manner by, for example, installing a program for implementing the functions (including a program stored in a storage medium not shown in the drawing).

The operation device 21 includes an input device, such as a keyboard or a pointing device, and outputs an instruction corresponding to an operation of a worker who uses the device maintenance apparatus 20 (an instruction to the device maintenance apparatus 20) to the processor 24. The display device 22 includes a display device, such as a liquid crystal display device, and displays various kinds of information output from the processor 24. The operation device 21 and the display device 22 may be physically separated from each other or physically integrated as a touch-panel-type liquid crystal display device which has both a display function and an operational function.

The storage 23 includes an auxiliary memory device, such as a hard disk drive (HDD) or a solid state drive (SSD), and stores various kinds of information. For example, the storage 23 stores output information IF1 (first information) relating to a loop test carried out by using the field device 11. The output information IF1 relating to the loop test includes information representing an output state of a test signal output from the field device 11. Specifically, as shown in FIG. 2, device information A1 (identification information), test execution information A2, output signal information A3 (information representing a level and an output start time of the level), and worker information A4 are included in the output information IF1.

The device information A1 is identification information allocated to each of the field devices 11 in order to identify the field devices 11. As the device information A1, tag information that is easily understood, such as "FI-1002A," is used. The device information A1 is read from the field device 11 and stored in the storage 23 under the control of the processor 24, for example, at the timing at which the device maintenance apparatus 20 is connected to the field device 11.

The test execution information A2 is information representing the date and time when the loop test is carried out (specifically, the date and time when the loop test begins and the date and time when the loop test ends). For example, "2018/05/21 16:03:30" may be stored as the start date and time of the loop test, and "2018/05/21 16:04:35" may be stored as the end date and time of the loop test. This information is stored in the storage 23 under the control of the processor 24. Specifically, information representing the start date and time of the loop test is stored in the storage 23 at the timing at which the loop test begins, and information representing the end date and time of the loop test is stored in the storage 23 at the timing at which the loop test ends.

The output signal information A3 is information representing a level of the test signal output from the field device 11 and an output start time and end time of the test signal. This information is stored in the storage 23 under the control of the processor 24 at the timing at which a test signal of each level is generated (the timing at which generation of a test signal ends). For example, when a loop test in which a level of a test signal is changed in sequence to 0%, 50%, 100%, 50%, and 0% is carried out (in the case of 5 point checking), the following information is stored in the storage 23.

0% start time: 2018/05/21 16:03:35
0% end time: 2018/05/21 16:03:45
50% start time: 2018/05/21 16:03:45
50% end time: 2018/05/21 16:03:55
100% start time: 2018/05/21 16:03:55
100% end time: 2018/05/21 16:04:10
50% start time: 2018/05/21 16:04:10
50 end time: 2018/05/21 16:04:2015
50% end time: 2018/05/21 16:04:20
0% start time: 2018/05/21 16:04:20
0% end time: 2018/05/21 16:04:30

As shown in the above example, the output signal information A3 is information in which an output start time and end time of each level are paired. When there is no end time to be paired with, an output start time of a next level or an end time of the loop test is treated as an end time of the level.

The worker information A4 is information relating to a worker who uses the device maintenance apparatus 20. For example, an account name required to log in to the device maintenance apparatus 20 is used as the worker information A4. For example, when the account name of a worker W1 who uses the device maintenance apparatus 20 is "YOKOGAWA TAROU," the name "YOKOGAWA TAROU" is stored in the storage 23 under the control of the processor 24 at the timing at which the worker W1 logs in to the device maintenance apparatus 20. As described above, the pieces of output information IF1 (the device information A1, the test execution information A2, the output signal information A3, and the worker information A4) are separately generated at the above-described timings (times) and stored in the storage 23.

The processor 24 controls overall operation of the device maintenance apparatus 20 on the basis of an operation instruction input from the operation device 21. The processor 24 includes a test executor 24a and a test information recorder 24b. When a loop test execution instruction is input from the operation device 21, the processor 24 causes the test executor 24a to carry out a loop test and causes the test information recorder 24b to record results of the performed loop test (to store the results in the storage 23).

The test executor 24a causes the field device 11 to output a test signal by transmitting a test signal output command to the field device 11 through the communicator 25. Specifically, according to a preset test pattern, the test executor 24a causes the field device 11 to output a test signal at a level set in the test pattern during an interval time set in the test pattern. The test information recorder 24b stores the above-described test execution information A2 and the output signal information A3 in the storage 23 as the loop test carried out by the test executor 24a proceeds.

The communicator 25 communicates with the connected the field device 11 under the control of the processor 24. When the device maintenance apparatus 20 is connected to the field device 11, communication between the device maintenance apparatus 20 and the field device 11 is started through the communicator 25 under the control of the processor 24, and device information of the field device 11 is acquired by the communicator 25. The acquired device information is stored in the storage 23 as the device information A1.

The input/output device 26 inputs or outputs various kinds of information under the control of the processor 24. For example, the input/output device 26 may input or output various kinds of information by communicating with an external device (for example, the test information management device 30) or may input or output various kinds of information by reading or writing various kinds of information in a detachable storage medium (for example, a non-volatile memory). Here, communication performed with the external device may be any of wired communication and wireless communication. Also, various kinds of information output from the input/output device 26 is, for example, the output information IF1 stored in the storage 23.

<Test Information Management Device>

Figure 3:
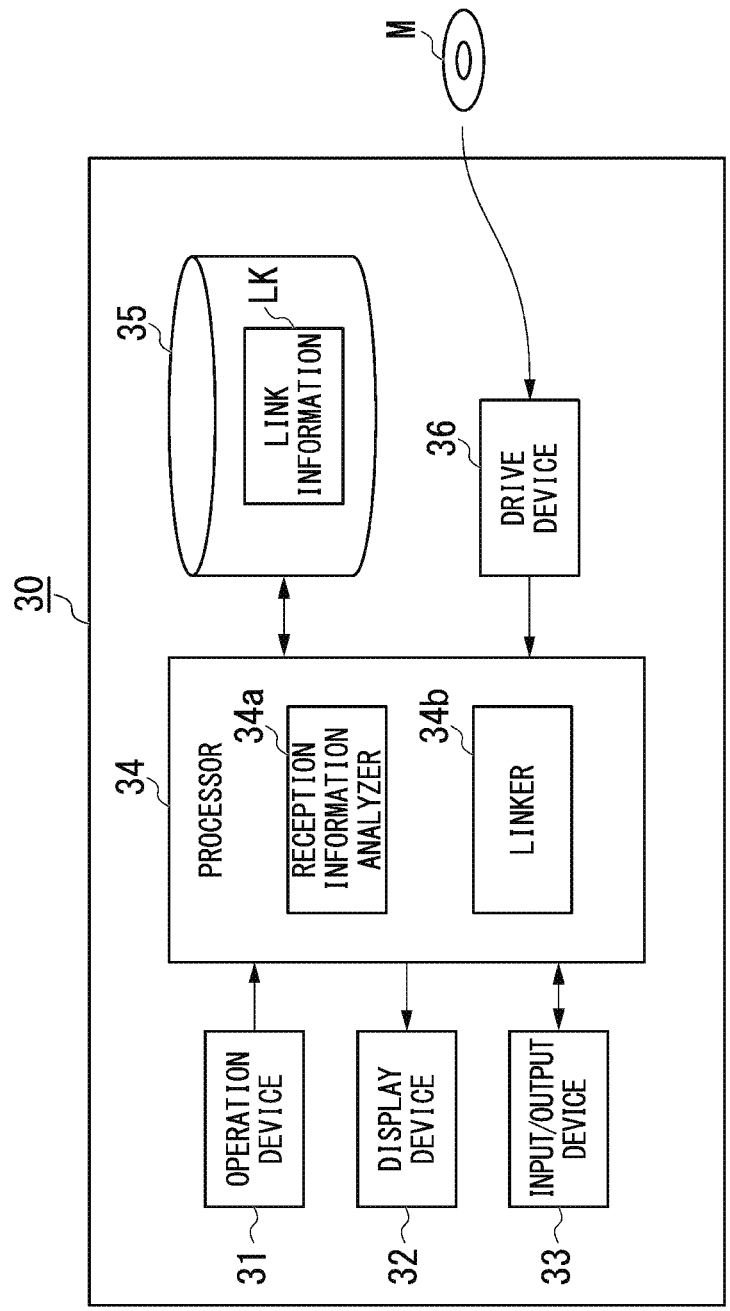
FIG. 3 is a block diagram showing a main constitution of a test information management device used in the first embodiment of the present invention.

FIG. 3 is a block diagram showing a main constitution of a test information management device used in the first embodiment of the present invention. As shown in FIG. 3, the test information management device 30 includes an operation device 31, a display device 32, an input/output device 33 (an outputter), a processor 34, a storage 35, and a drive device 36. For example, such a test information management device 30 is implemented as a desktop-type or note-type personal computer, a workstation, or the like. Functions of the test information management device 30 (functions for managing results of a loop test) are implemented in a software manner by, for example, installing a program for implementing the functions (including a program stored in a storage medium M).

The operation device 31 includes an input device, such as a keyboard or a pointing device, and outputs an instruction corresponding to an operation of a worker who uses the test information management device 30 (an instruction to the test information management device 30) to the processor 34. The display device 32 includes a display device, such as a liquid crystal display device, and displays various kinds of information output from the processor 34. The operation device 31 and the display device 32 may be physically separated from each other or physically integrated as a touch panel-type liquid crystal display device which has both a display function and an operational function.

The input/output device 33 inputs or outputs various kinds of information under the control of the processor 34. For example, the input/output device 33 may input or output various kinds of information by communicating with an external device (for example, the device maintenance apparatus 20, the monitoring device 14, and the camera 40) or may input or output various kinds of information by reading or writing various kinds of information in a detachable storage medium (for example, a non-volatile memory). Here, communication performed with the external device may be any of wired communication and wireless communication. Information input to the input/output device 33 is, for example, the output information IF1, the reception information IF2, and reception information IF3 shown in FIG. 1, and information output from the input/output device 33 is, for example, link information LK stored in the storage 35.

The processor 34 controls overall operation of the device test information management device 30 on the basis of an operation instruction input from the operation device 31. The processor 34 includes a reception information analyzer 34a (an analyzer) and a linker 34b (a linking means) and links together the output information IF1 obtained from the device maintenance apparatus 20 and the reception information IF2 obtained from the monitoring device 14 or the reception information IF3 (see FIG. 1) obtained from the camera 40.

Figure 4:
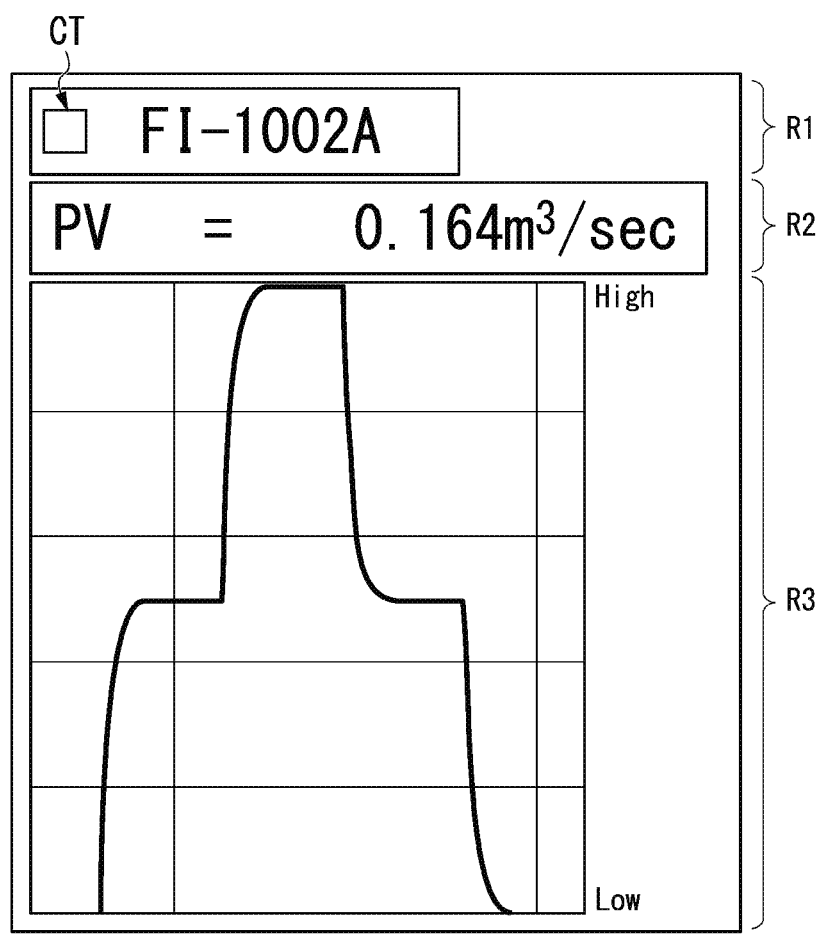
FIG. 4 is a diagram showing an example of image information included in reception information obtained by a monitoring device according to the first embodiment of the present invention.

The reception information analyzer 34a performs image analysis on image information included in the reception information IF2 obtained from the monitoring device 14 or the reception information IF3 obtained from the camera 40 and obtained reception results of a test signal and device information of the field device 11. FIG. 4 is a diagram showing an example of image information included in reception information obtained by a monitoring device according to the first embodiment of the present invention. The image information shown as an example in FIG. 4 is divided into a first region R in which a tag name of the field device 11 is displayed, a second region R2 in which a reception value of a test signal is displayed, and a third region R3 in which a graph showing a change in the reception value over time is displayed. In the example shown in FIG. 4, a symbol CT "■" and the tag name "FI-1002A" are displayed in the first region R1, the reception value "PV-0.164 m³/sec" of a test signal is displayed in the second region R2, and a graph in which the reception value changes in five stages over time is displayed in the third region R3.

As described above, in an image included in the reception information IF2 obtained from the monitoring device 14, an arrangement of a tag name, a reception value, and a graph is almost determined and made into rules such as that the symbol CT "■" is necessarily provided beside a tag name. The reception information analyzer 34a performs image analysis on image information included in the reception information IF2 or IF3 according to such rules and obtains the reception results (the reception value) of the test signal and device information (tag information) of the field device 11.

The linker 34b links together the output information IF1 obtained from the device maintenance apparatus 20 and the reception information IF2 obtained from the monitoring device 14 or the reception information IF3 obtained from the camera 40. Specifically, the linker 34b links together the output information IF1 and the reception information IF2 or the reception information IF3 by using at least one of the device information (tag information) of the field device 11 and the times at which the respective pieces of information have been generated.

When the reception results (the reception value) of the test signal have been obtained by the reception information analyzer 34a, the linker 34b may link together the output information IF1 obtained from the device maintenance apparatus 20 and the reception value obtained by the reception information analyzer 34a. Also, when the device information (the tag information) of the field device 11 has been obtained by the reception information analyzer 34a, the linker 34b may link together the output information IF1 and the reception information IF2 or the reception information IF3 by using the tag information obtained by the reception information analyzer 34a.

The storage 35 includes an auxiliary memory device, such as a hard disk drive (HDD) or a solid state drive (SSD), and stores various kinds of information. For example, the storage 35 stores the link information LK linked by the linker 34b of the processor 34. The drive device 36 reads data stored in the computer-readable storage medium M, such as a compact disc read only memory (CD-ROM) or a digital versatile disc (DVD: registered trademark)-ROM. The storage medium M stores a program for executing functions of each block of the test information management device 30 (for example, functions of the reception information analyzer 34a and the linker 34b).

When the program stored in such a storage medium M is read by the drive device 36 and installed on the test information management device 30, functions of each block of the test information management device 30 are implemented in a software manner. In other words, these functions are implemented by cooperation between software and hardware resources. Here, the program for implementing functions of each block of the test information management device 30 may be distributed as stored in the storage medium M or may be distributed via an external network such as the Internet.

When the test information management device 30 does not include the drive device 36, the program is acquired via an external network such as the Internet. Specifically, the test information management device 30 stores the program, for example, acquired by the input/output device 33 via the external network in the storage 35. Also, the manufacturer of the test information management device 30 can store the program for implementing functions of each block in the storage 35 in advance as a pre-installed version of the test information management device 30.

<Camera>

The camera 40 includes a solid-state imaging element, such as a charge coupled device (CCD) or a complementary metal oxide semiconductor (CMOS), and is a camera capable of imaging a two-dimensional still image. The camera 40 is operated by, for example, the operator W2 of the plant and used to capture image information of all or some of content displayed by the display device 14a of the monitoring device 14. In other words, the camera 40 can acquire information, such as a so-called screenshot, like the reception information acquirer 14b provided in the monitoring device 14.

Time information (a timestamp) representing the time at which the image information has been captured by the camera 40 is appended to the image information, and the image information is stored in, for example, a detachable storage medium (for example, a non-volatile memory). In other words, information (the reception information IF3: second information) including the image information representing the reception results of the signal received by the controller 13 is generated. The information stored in the storage medium is output to an external device (for example, the test information management device 30) as the reception information IF3, for example, when communication is performed between the camera 40 and the external device. Alternatively, when the storage medium is removed from the camera 40 and the removed storage medium is installed in an external device (for example, the test information management device 30), the storage medium is read by the external device as the reception information IF3. Here, the reception information acquirer 14b provided in the monitoring device 14 can acquire a so-called screenshot, and thus the camera 40 is not necessarily used.

<Test Information Management Method>

Figure 5:
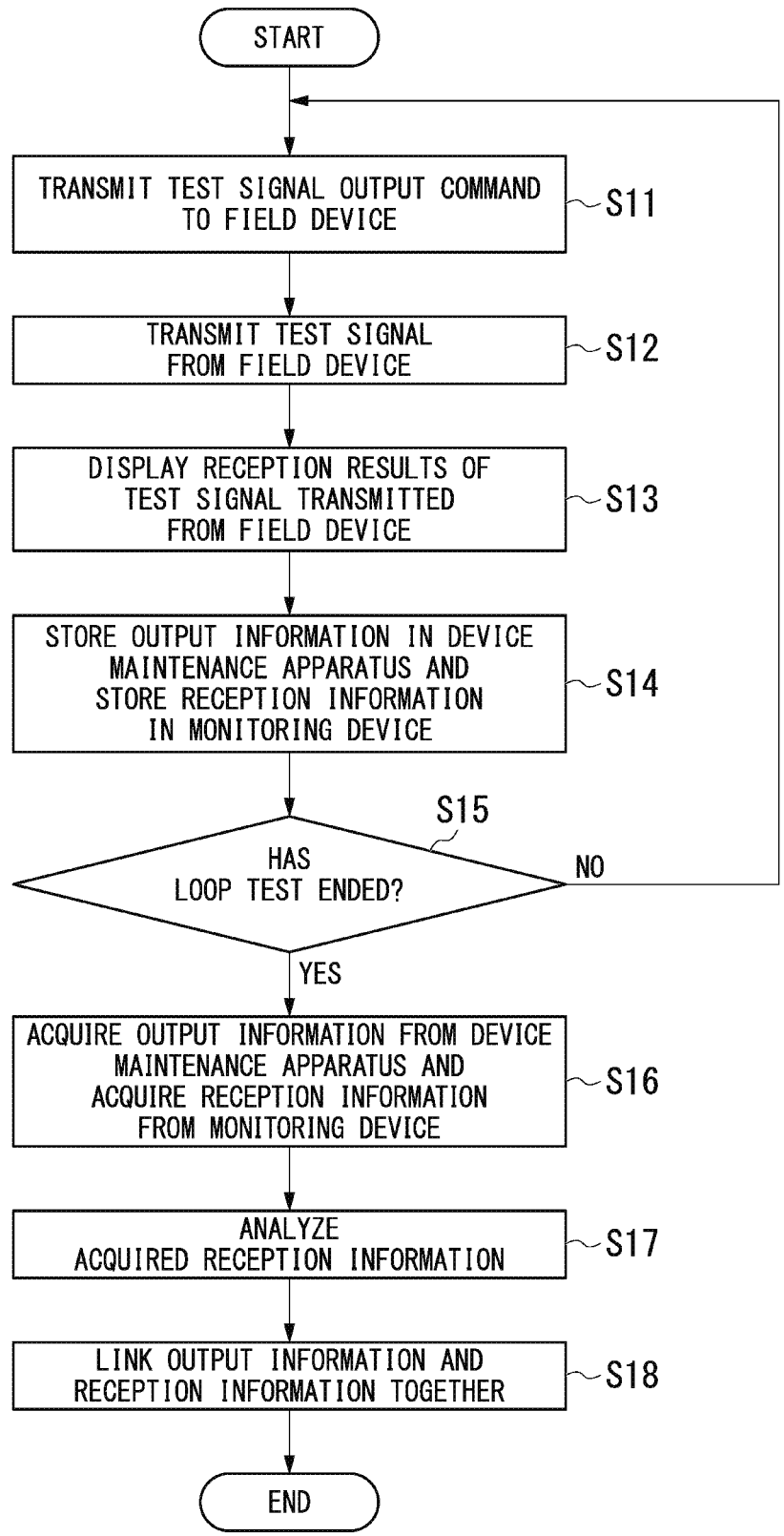
FIG. 5 is a flowchart showing an overview of a test information management method according to the first embodiment of the present invention.

FIG. 5 is a flowchart showing an overview of a test information management method according to the first embodiment of the present invention. The processing of the flowchart shown in FIG. 5 is started, for example, when the worker W1 who operates the device maintenance apparatus 20 issues a loop test start instruction by operating the operation device 21. Here, it is assumed that a loop test is carried out by cooperation between the field worker W1 who operates the device maintenance apparatus 20 and the operator W2 of the plant.

When the processing of the flowchart of FIG. 5 begins, a test signal output command is transmitted from the device maintenance apparatus 20 to the field device 11 (the sensor device 11a) (step S11). When a loop test is started, the operator W2 is notified of the purport by the worker W1. The notification of the purport that a loop test has been started may be provided by the device maintenance apparatus 20 communicating with the monitoring device 14 or provided by the worker W1 communicating with the operator W2 through a communication device such as a transceiver.

When the output command transmitted from the device maintenance apparatus 20 is received by the field device 11 (the sensor device 11a), a test signal corresponding to the output command is transmitted from the field device 11 (the sensor device 11a) (step S12). The test signal transmitted from the field device 11 (the sensor device 11a) is received by the controller 13 via a transmission line C1, the I/O device 12, and the cable C2 in sequence. When the test signal is received by the controller 13, the reception results are displayed on the display device 14a of the monitoring device 14 (step S13).

Then, a process of storing the output information IF1 relating to the loop test is performed by the device maintenance apparatus 20, and a process of acquiring and storing the reception information IF2 is performed by the monitoring device 14 (step S14). In order to simplify description, the output information IF1 and the reception information IF2 are considered to be collectively stored in step S14, but these pieces of information are stored as the loop test proceeds. For example, the output signal information A3 included in the output information IF1 is stored in the storage 23 at the timing at which a test signal of each level is generated, and the reception information IF2 is stored in the reception information storage 14c at the timing at which a test signal value is changed.

Here, an example in which a process of acquiring and storing the reception information IF2 is performed by the monitoring device 14 has been described. Instead of this process, however, a process of acquiring and storing the reception information IF3 by the camera 40 may be performed. Specifically, the operator W2 takes a picture of the display device 14a of the monitoring device 14 by operating the camera 40. In this way, the reception information IF3 is acquired by the camera 40, and the acquired reception information IF3 is stored in, for example, a detachable storage medium (for example, a non-volatile memory).

When the above processing ends, the processor 24 of the device maintenance apparatus 20 determines whether the loop test has ended (step S15). When it is determined that the loop test has not ended (when the determination result is "NO"), the process returns to the processing of step S11, and the processing of steps S11 to S14 is performed again so that the loop test continues. Whether the loop test has ended is determined according to whether a test signal regarding a whole preset test pattern has been output from the field device 11 (the sensor device 11a).

With regard to this, when it is determined that the loop test has ended (when the determination result is "YES"), the test information management device 30 performs a process of acquiring the output information IF1 from the device maintenance apparatus 20 and acquiring the reception information IF2 from the monitoring device 14 (step S16). When the reception information IF3 acquired by the camera 40 has been stored in a detachable storage medium or the like, the test information management device 30 may perform a process of acquiring the reception information IF3 stored in the storage medium or the like instead of the process of acquiring the reception information IF2 from the monitoring device 14.

Next, the test information management device 30 performs a process of analyzing the reception information IF2 acquired from the monitoring device 14 (or the reception information IF3 acquired from the camera 40) (step S17). Specifically, the reception information analyzer 34a of the test information management device 30 performs a process of conducting image analysis on image information included in the reception information IF2 (or the reception information IF3) and obtaining reception results of the test signal and the device information of the field device 11. Here, it is possible to omit step S17 when it is not necessary.

Subsequently, the test information management device 30 performs a process of linking together the output information IF1 acquired from the device maintenance apparatus 20 and the reception information IF2 acquired from the monitoring device 14 (or the reception information IF3 acquired from the camera 40) (step S18: a linking step). Specifically, the linker 34b of the test information management device 30 performs a process of linking together the output information IF1 and the reception information IF2 or the reception information IF3 by using at least one of the device information (tag information) of the field device 11 and the times at which the respective pieces of information have been generated.

For example, the output information IF1 acquired from the device maintenance apparatus 20 includes the device information A1 for identifying the field device 11 (the sensor device 11a) (see FIG. 2). Also, in step S17, it is possible to obtain the device information of the field device 11 by performing image analysis on the image information included in the reception information IF2 acquired from the monitoring device 14 (or the reception information IF3 acquired from the camera 40) (see FIG. 4). When the device information A1 included in the output information IF1 coincides with device information obtained by performing image analysis on the image information included in the reception information IF2 or the reception information IF3, the linker 34b of the test information management device 30 links together the output information IF1 including the device information A1 and the reception information IF2 or the reception information IF3 from which the device information has been acquired.

For example, the output information IF1 acquired from the device maintenance apparatus 20 includes the output signal information A3 representing a level of the test signal output from the field device 11 and an output start time and end time of the test signal (see FIG. 2). Also, in step S17, time information (a timestamp) has been appended to the image information IF2 acquired from the monitoring device 14 (or the reception information IF3 acquired from the camera 40). The linker 34b of the test information management device 30 compares the output signal information A3 included in the output information IF1 with the time information appended to the reception information IF2 or the reception information IF3 and links together the output information IF1 and the reception information IF2 or the reception information IF3 with reference to the comparison results.

For example, it is assumed that the time information appended to the reception information IF2 or the reception information IF3 is "2018/05/21 16:04:02." Also, content of the output signal information A3 is assumed to be as follows.

50% start time: 2018/05/21 16:03:45
50% end time: 2018/05/21 16:03:55
100% start time: 2018/05/21 16:03:55
100% end time: 2018/05/21 16:04:10
50% start time: 2018/05/21 16:04:10
50% end time: 2018/05/21 16:04:20

The time information "2018/05/21 16:04:02" appended to the reception information IF2 or the reception information IF3 is obtained when the level of the test signal is 100% (between 16:03:55 and 16:04:10 on May 21, 2018). To this end, the linker 34b of the test information management device 30 links together a piece of information obtained when the level of the test signal is 100% among the pieces of output signal information A3 included in the output information IF1 and the reception information IF2 or the reception information IF3 to which the time information "2018/05/21 16:04:02" has been appended.

The output information IF1 and the reception information IF2 or the reception information IF3 which have been linked together by the linker 34b of the test information management device 30 are stored in the storage 35 of the test information management device 30 as the link information LK. In this way, the series of processing steps shown in FIG. 5 ends. The link information LK stored in the storage 35 is displayed on the display device 22 provided in the test information management device 30 in response to, for example, a request from an external device or is output to the outside of the test information management device 30 from the input/output device 26.

As described above, in the present embodiment, the test information management device 30 acquires the output information IF1 relating to a loop test from the device maintenance apparatus 20 and also acquires the reception information IF2 including image information representing reception results of a test signal of the loop test from the monitoring device 14 (or acquires the reception information IF3 from the camera 40). Then, the test information management device 30 automatically links together the acquired output information IF1 and the acquired reception information IF2 or reception information IF3 by using at least one of device information for identifying the field device 11 (the sensor device 11a) and the times at which the output information IF1 and the reception information IF2 or the reception information IF3 have been generated. In this way, it is possible to integrally manage information relating to a loop test and including test results of the test, and thus the reliability of the loop test can be ensured.

Also, the test information management device 30 can acquire the output information IF1, the reception information IF2, and the reception information IF3 by communicating with the device maintenance apparatus 20, the monitoring device 14, and the camera 40 (or by using a detachable storage medium (for example, a non-volatile memory)). For this reason, when the test information management device 30 acquires the output information IF1, the reception information IF2, and the reception information IF3, the worker W1 and the operator W2 do not need to communicate with each other by using a transceiver and the like. In this way, it is possible to easily acquire the output information IF1, the reception information IF2, and the reception information IF3.

Modified Example

Figure 6:
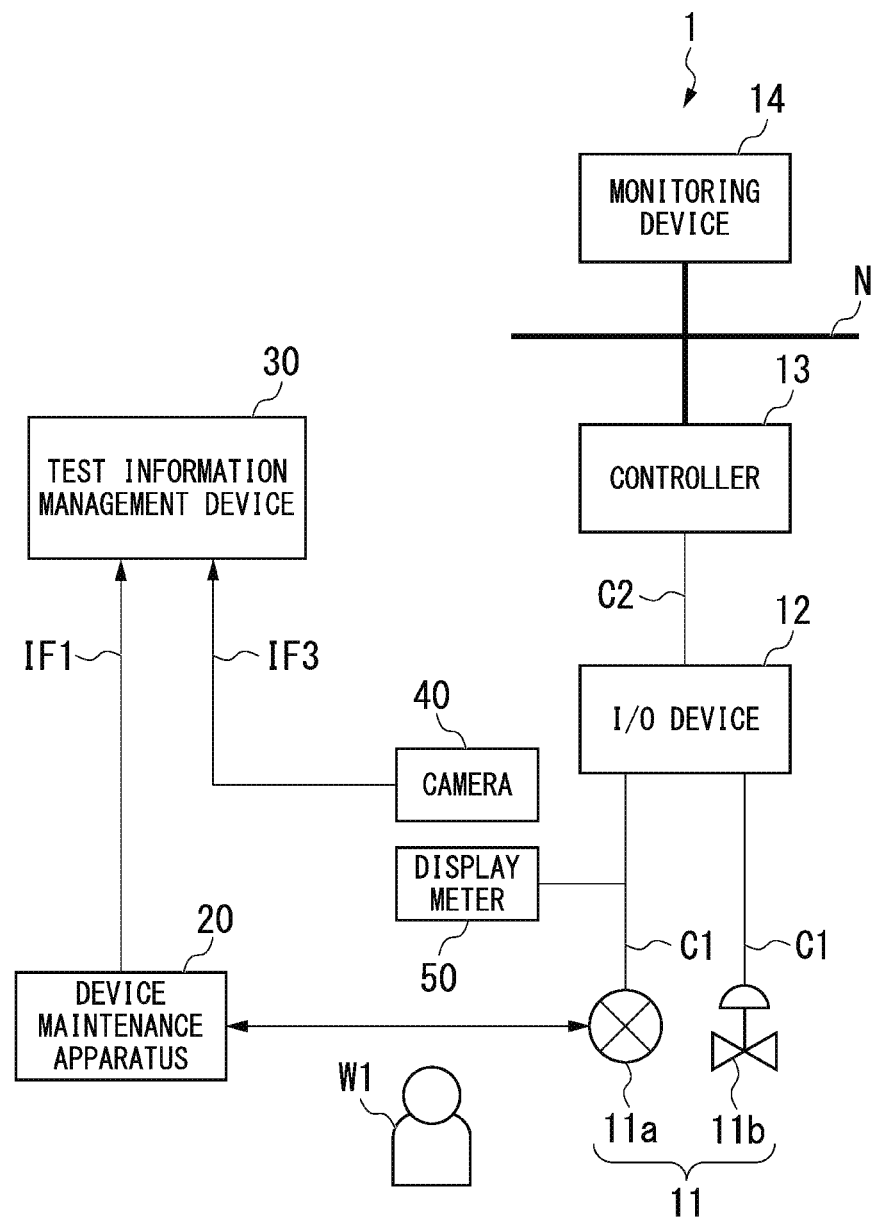
FIG. 6 is a diagram showing a modified example of the first embodiment of the present invention.

FIG. 6 is a diagram showing a modified example of the first embodiment of the present invention. In FIG. 6, components identical to those shown in FIG. 1 are given the same reference signs. As shown in FIG. 6, in the present modified example, a display meter 50 (a second device) is provided on, for example, a transmission line C1 connected to the field device 11 (the sensor device 11a) and the I/O device 12, and content display by the display meter 50 (reception results of a test signal) is captured by the camera 40 such that the reception information IF3 may be obtained. The display meter 50 may be provided on the cable C2 which connects the I/O device 12 and the controller 13.

Figure 7A:
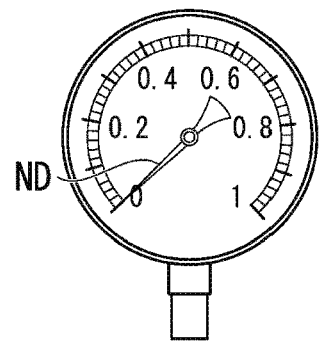
FIG. 7A is a diagram showing an example of a display meter used in the modified example of the first embodiment of the present invention.
Figure 7B:
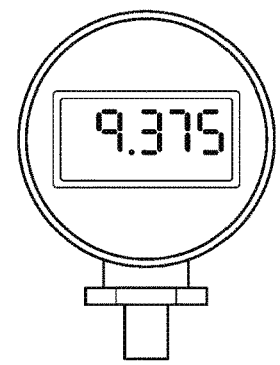
FIG. 7B is a diagram showing an example of a display meter used in the modified example of the first embodiment of the present invention.
Figure 7C:
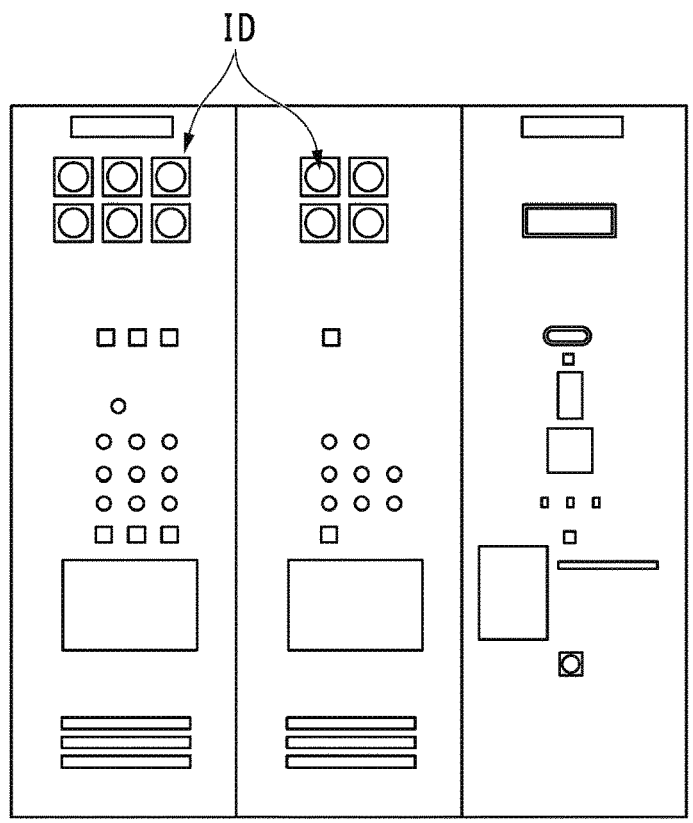
FIG. 7C is a diagram showing an example of a display meter used in the modified example of the first embodiment of the present invention.

FIG. 7A to FIG. 7C are diagrams showing an example of a display meter used in the modified example of the first embodiment of the present invention. The display meter shown in FIG. 7A is an analog display meter, and the display meter shown in FIG. 7B is a digital display meter. These display meters shown in FIG. 7A and FIG. 7B are provided on a transmission line C1 and display the magnitude of a signal (for example, a test signal) transmitted through the transmission line C1. The display meter shown in FIG. 7A displays the magnitude of the signal transmitted through the transmission line C1 (the test signal) with the amount of rotation of an indicating needle ND. The display meter shown in FIG. 7B displays the magnitude of the signal transmitted through the transmission line C1 (the test signal) with a value. Also, the display meter shown in FIG. 7C is a panel display meter in which a plurality of indicators ID are provided. Among the plurality of indicators ID provided in the panel display meter, an indicator connected to the transmission line C1 is used.

In the embodiment described with FIG. 1, the target section of a loop test is between the field device 11 (the sensor device 11a) and the controller 13. In contrast to this, in the present modified example, the target section of a loop test is between the field device 11 (the sensor device 11a) and the display meter 50. In the present modified example, the reception information IF2 acquired from the monitoring device 14 is not used, and the output information IF1 acquired from the device maintenance apparatus 20 and the reception information IF3 acquired from the camera 40 are linked together by the test information management device 30. Even in the present modified example, it is possible to integrally manage information relating to a loop test and including test results of the test, and thus the reliability of the loop test can be ensured.

Second Embodiment

<Test Information Management System>

Figure 8:
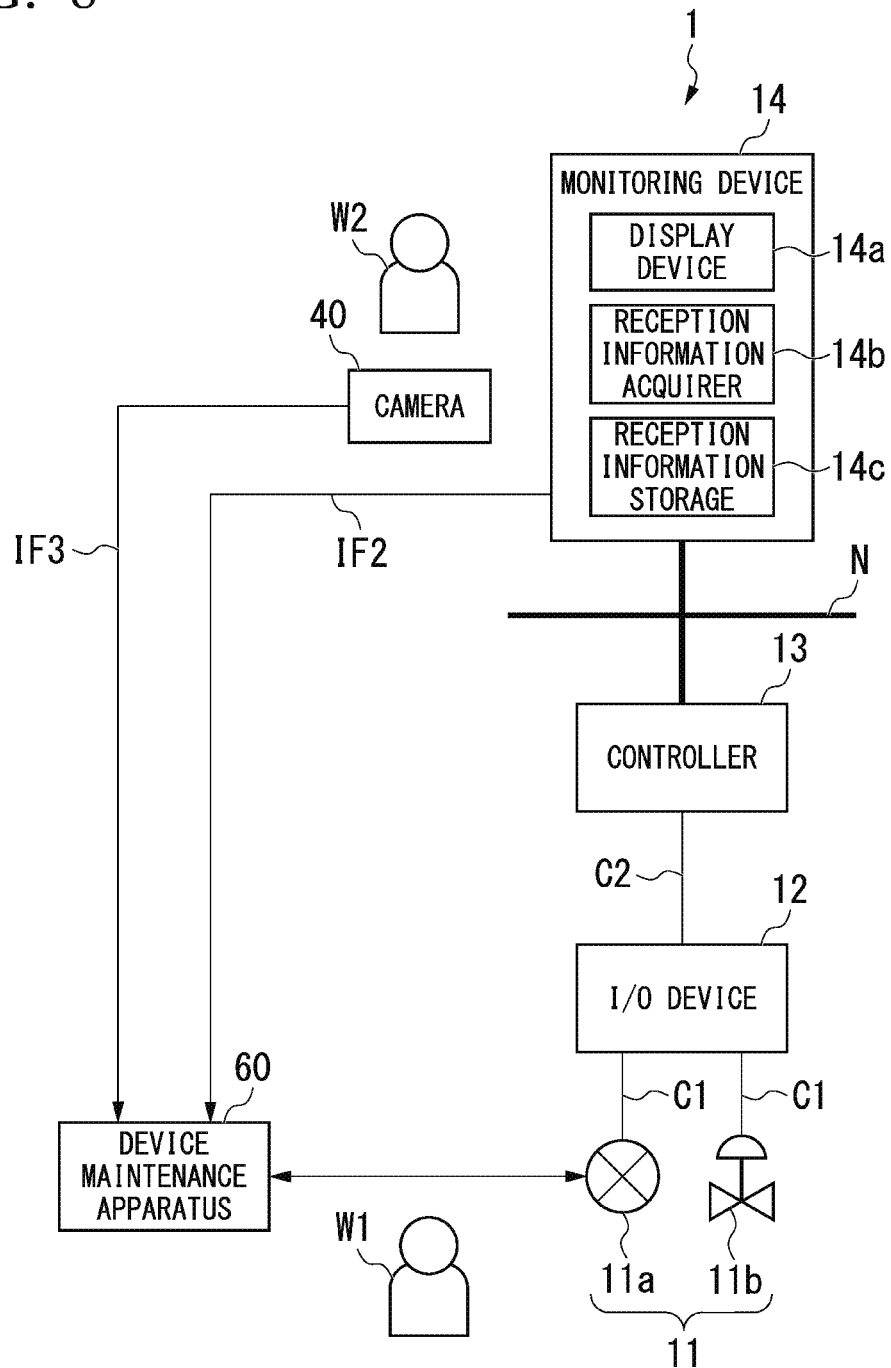
FIG. 8 is a block diagram showing a main constitution of a test information management system according to a second embodiment of the present invention.

FIG. 8 is a block diagram showing a main constitution of a test information management system according to a second embodiment of the present invention. In FIG. 8, components identical to those shown in FIG. 1 are given the same reference signs. In the present embodiment, a device maintenance apparatus 60 having the functions of the test information management device 30 shown in FIG. 1 is used to maintain the field device 11 and the like and manage results of a loop test. To this end, a test information management system according to the present embodiment is composed of a monitoring device 14 in addition to the device maintenance apparatus 60 (further, a camera 40).

<Device Maintenance Apparatus>

Figure 9:
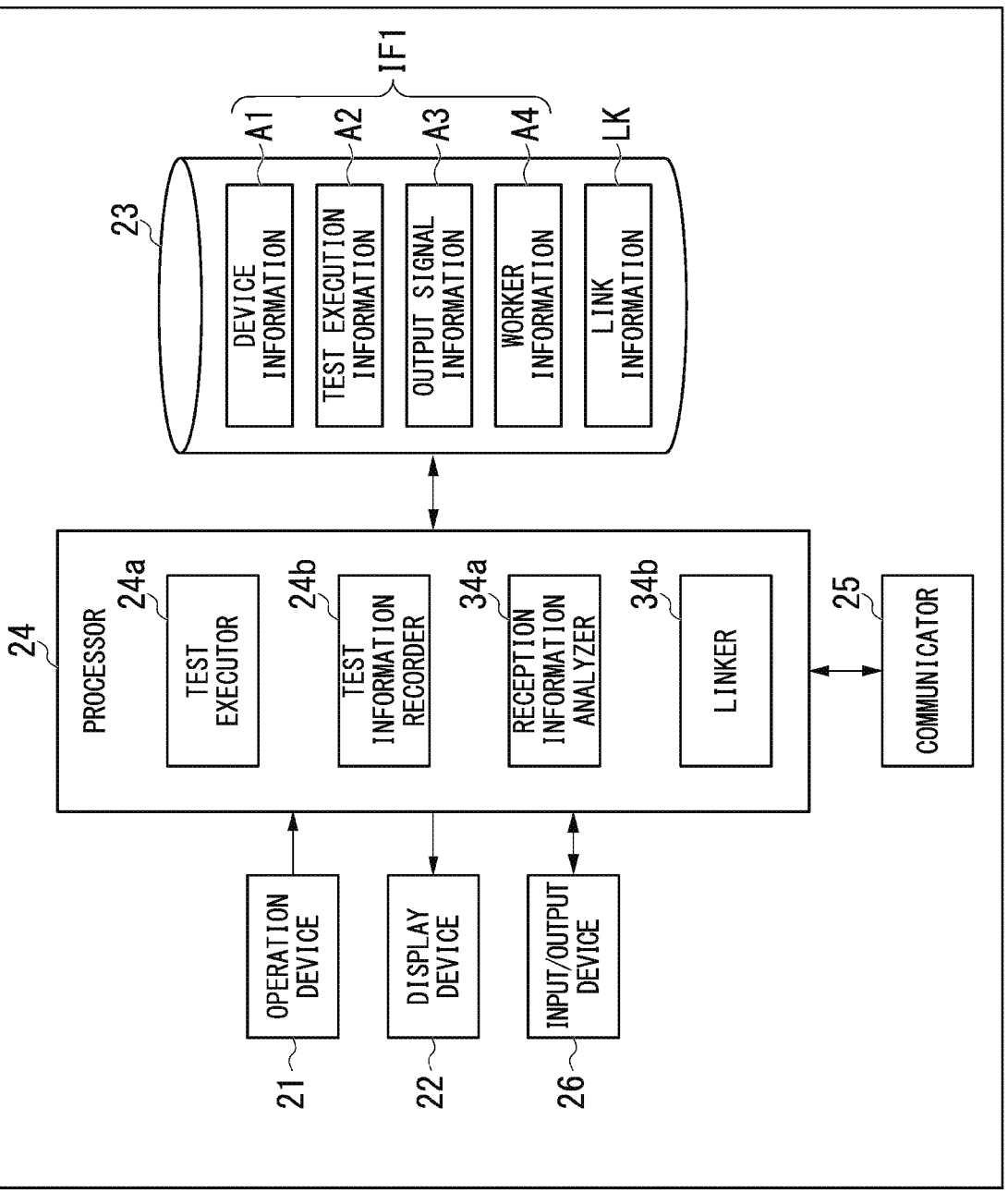
FIG. 9 is a block diagram showing a main constitution of a device maintenance apparatus used in the second embodiment of the present invention.

FIG. 9 is a block diagram showing a main constitution of a device maintenance apparatus used in the second embodiment of the present invention. In FIG. 9, components identical to those shown in FIG. 2 or 3 are given the same reference signs. As shown in FIG. 9, the device maintenance apparatus 60 is obtained by adding the reception information analyzer 34a and the linker 34b shown in FIG. 3 to the device maintenance apparatus 20 shown in FIG. 2 and stores the link information LK shown in FIG. 3 in the storage 23.

Through the linker 34b, the device maintenance apparatus 60 links together output information IF1 stored in the storage 23 and reception information IF2 obtained from the monitoring device 14 or reception information IF3 obtained from the camera 40. Specifically, the device maintenance apparatus 60 links together the output information IF1 and the reception information IF2 or the reception information IF3 by using at least one of device information (tag information) of the field device 11 and times at which the respective pieces of information have been generated. The linked output information IF1 and reception information IF2 or reception information IF3 are stored in the storage 23 as the link information LK. The link information LK stored in the storage 23 is output from, for example, an input/output device 26 (an outputter).

As described above, in the present embodiment, the output information IF1 relating to a loop test is acquired from the storage 23 of the device maintenance apparatus 60, and the reception information IF2 including image information representing reception results of a test signal of the loop test is also acquired from the monitoring device 14 (or the reception information IF3 is acquired from the camera 40). Then, the acquired output information IF1 and the acquired reception information IF2 or reception information IF3 are automatically linked together by using at least one of device information for identifying the field device 11 (the sensor device 11a) and the times at which the output information IF and the reception information IF2 or the reception information IF3 have been generated. In this way, it is possible to integrally manage information relating to a loop test and including test results of the test, and thus the reliability of the loop test can be ensured.

Since it is possible to omit the test information management device 30 of the first embodiment by implementing the functions of the test information management device 30 with the device maintenance apparatus 60, the test information management system can be simply configured. Further, since the device maintenance apparatus 60 is carried and used by a worker W1, it is possible to easily acquire and check the output information IF1, the reception information IF2, and the reception information IF3.

Third Embodiment

<Test Information Management System>

Figure 10:
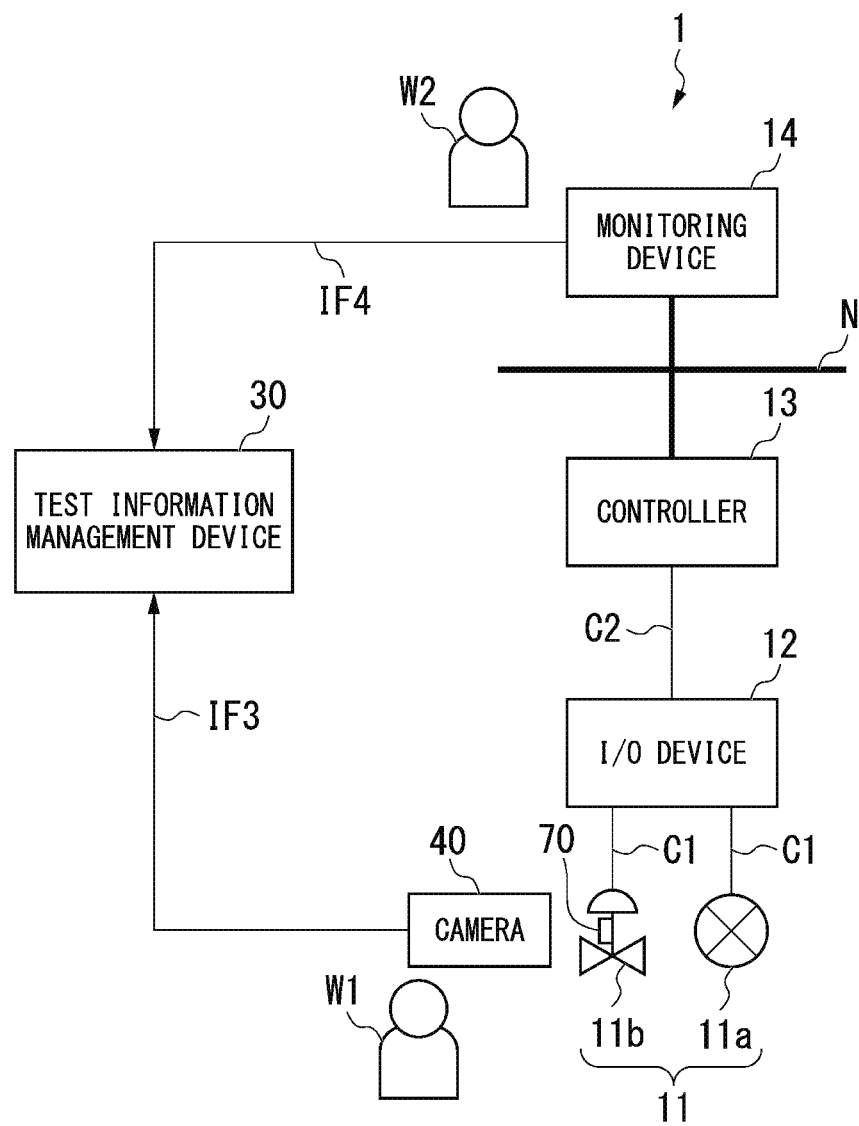
FIG. 10 is a block diagram showing a main constitution of a test information management system according to a third embodiment of the present invention.

FIG. 10 is a block diagram showing a main constitution of a test information management system according to a third embodiment of the present invention. In FIG. 10, components identical to those shown in FIG. 1 are given the same reference signs. In the above-described first and second embodiments, a test signal is transmitted from the field device 11 (the sensor device 11a) to perform a loop test.

In contrast to this, in the present embodiment, a test signal is output from a controller 13 (a first device) under the control of a monitoring device 14 (a first device) to test an operation state of the field device 11 (a valve device 11b: a second device). For example, a stroke test of the valve device 11b is performed. To this end, the test information management system according to the present embodiment is composed of the monitoring device 14 in addition to the device maintenance apparatus 30 and a camera 40. The stroke test is a test for checking whether a valve operates normally in the case of changing a flow rate of a fluid or completely closing the valve in an emergency.

As mentioned above, the monitoring device 14 causes the controller 13 to output a test signal. To this end, output information IF4 (first information) relating to a stroke test of the field device 11 (the valve device 11b) is generated and stored in the monitoring device 14. The output information IF4 relating to the stroke test includes information representing an output state of the test signal output from the controller 13. The output information IF4 is identical to the output information IF1 shown in FIG. 2 and includes device information A1, test execution information A2, output signal information A3, and worker information A4. However, in the device information A1, device information of the field device 11 (the valve device 11b) to which the test signal is transmitted is stored.

The camera 40 is used to take a picture of an operation state of the valve device 11b. Here, the valve device 11b includes a display device 70 for displaying results of operating on the basis of the test signal output from the controller 13. For example, when a mechanical display device for showing the degree of opening (the degree of opening which changes according to the test signal transmitted from the controller 13) is provided as the display device 70 to the valve device 11b, a picture of the display device is taken by the camera 40. Also, when a valve positioner for controlling the degree of opening of a regulating valve is provided to the valve device 11b, a picture of an indication value (a value representing the degree of opening of the regulating valve) displayed on the display device 70 provided on the valve positioner is taken by the camera 40. In this way, reception information IF3 including image information representing reception results of the test signal relating to the stroke test is generated.

The test information management device 30 links together the output information IF4 obtained from the monitoring device 14 and the reception information IF3 obtained from the camera 40. Specifically, the test information management device 30 links together the output information IF4 and the reception information IF3 by using at least one of the device information (tag information) of the field device 11 (the valve device 11b) and times at which the respective pieces of information have been generated. The linked output information IF4 and reception information IF3 are stored in the storage 35 (see FIG. 3) as link information LK.

As described above, in the present embodiment, the output information IF4 relating to a stroke test is acquired from the monitoring device 14, and the reception information IF3 including image information representing reception results of a test signal of the stroke test is also acquired from the camera 40. Then, the acquired output information IF4 and the acquired reception information IF3 are automatically linked together by using at least one of device information for identifying the field device 11 (the valve device 11b) and the times at which the output information IF4 and the reception information IF3 have been generated. In this way, it is possible to integrally manage information relating to a stroke test and including test results of the test, and thus the reliability of the stroke test can be ensured.

A test information management device, a test information management method, a test information management program, and a storage medium according to embodiments of the present invention have been described above. However, the present invention is not limited to the above-described embodiments and can be freely modified within the scope of the present invention. For example, in the above-described first and second embodiments, the device maintenance apparatuses 20 and 60 are used to obtain the output information IF1 by causing the field device 11 (the sensor device 11a) to generate a test signal of a loop test. However, the field device 11 (the sensor device 11a) may be directly operated to generate a test signal of a loop test. Also, when the field device 11 (the sensor device 11a) has the function of recording the output information IF1, the output information IF1 may be acquired from the field device 11 (the sensor device 11a).

An embodiment of the test information management device 30 shown in FIG. 1 and FIG. 10 can be implemented in an arbitrary form without limitations. For example, the test information management device 30 may be implemented as a server device which is connected to the control network N or may be implemented as a standalone device provided in a plant. Further, the test information management device 30 may be implemented by cloud computing.

Here, the cloud computing may correspond to, for example, a definition (a definition recommended by the National Institute of Standards and Technology) stated in the document specified by the following uniform resource locator (URL).

http://nvlpubs.nist.gov/nistpubs/Legacy/SP/nistspecialpublication800-145.pdf http://www.ipa.go.jp/files/000025366.pdf The test information management device according to an aspect of the present invention may include an analyzer (34a) which performs image analysis on the image information included in the second information and obtains at least one of the reception results of the test signal and the identification information for identifying the first device or the second device.

In the test information management device according to an aspect of the present invention, the linker may link the reception results of the test signal obtained by the analyzer to the first information.

In the test information management device according to an aspect of the present invention, the linker may link the first information and the second information together by using the identification information obtained by the analyzer.

In the test information management device according to an aspect of the present invention, the first information may include at least the identification information (A1) for identifying the first device and information (A3) indicating a level of the test signal and an output start time of the level.

The test information management device according to an aspect of the present invention may include an outputter (33) which outputs the first information and the second information linked together by the linker.

The test information management device according to an aspect of the present invention may include a communicator (25) which performs communication with the first device and a test executor (24a) which causes the first device to output the test signal by transmitting an output instruction of the test signal to the first device through the communicator.

In the test information management device according to an aspect of the present invention, the communicator may acquire the identification information from the first device.

In the test information management device according to an aspect of the present invention, the first device may be a field device (11a), and the second device may be a device (14 or 50) including a display device (14a) which displays the reception results of the test signal output from the field device.

In the test information management device according to an aspect of the present invention, the first device may be a device (13 or 14) capable of outputting an operation signal for operating the field device as the test signal, and the second device may be a field device (11b) including a display device (70) which displays results of operation based on the test signal output from the first device.

A test information management method according to an aspect of the present invention is a test information management method for managing test information relating to a test carried out by receiving a test signal output from a first device (11a or 14) in a second device (13, 14, or 11b), and the test information management method may include linking (S18), by a linker (34b), together first information (IF1 or IF4) including information representing an output state of the test signal in the first device and second information (IF2 or IF3) including image information representing reception results of the test signal in the second device using at least one of identification information for identifying the first device or the second device and times at which the first information and the second information are generated.

The test information management method according to an aspect of the present invention may further include performing, by an analyzer, image analysis on the image information included in the second information, and obtaining, by an analyzer, at least one of the reception results of the test signal and the identification information for identifying the first device or the second device.

The test information management method according to an aspect of the present invention may further include linking, by the linker, the reception results of the test signal obtained by the analyzer to the first information.

The test information management method according to an aspect of the present invention may further include linking, by the linker, the first information and the second information together by using the identification information obtained by the analyzer.

In the test information management method according to an aspect of the present invention, the first information may include at least the identification information for identifying the first device and information indicating a level of the test signal and an output start time of the level.

The test information management method according to an aspect of the present invention may further include outputting, by an outputter, the first information and the second information linked together by the linker.

The test information management method according to an aspect of the present invention may further include performing, by a communicator, communication with the first device, and causing, by a test executor, the first device to output the test signal by transmitting an output instruction of the test signal to the first device through the communicator.

The test information management method according to an aspect of the present invention may further include acquiring, by the communicator, the identification information from the first device.

In the test information management method according to an aspect of the present invention, the first device may be a field device, and the second device may be a device including a display device which displays the reception results of the test signal output from the field device.

A test information management program according to an aspect of the present invention is a test information management program configured for execution by a computer of a test information management device (30 or 60) which manages test information relating to a test carried out by receiving a test signal output from a first device (1a or 13 and 14) in a second device (13, 14, 50, or 11b), and the test information management program may include instructions for linking (S18), by a linker (34b), together first information (IF1 or IF4) including information representing an output state of the test signal in the first device and second information (IF2 or IF3) including image information representing reception results of the test signal in the second device using at least one of identification information for identifying the first device or the second device and times at which the first information and the second information are generated.

A non-transitory computer readable storage medium according to an aspect of the present invention is a non-transitory computer readable storage medium storing one or more test information management programs configured for execution by a computer of a test information management device (30 or 60) which manages test information relating to a test carried out by receiving a test signal output from a first device (11a or 13 and 14) in a second device (13, 14, 50, or 11b), and the one or more test information management programs may include instructions for linking (S18), by a linker (34b), together first information (IF1 or IF4) including information representing an output state of the test signal in the first device and second information (IF2 or IF3) including image information representing reception results of the test signal in the second device using at least one of identification information for identifying the first device or the second device and times at which the first information and the second information are generated.

As used herein, the following directional terms "front, back, above, downward, right, left, vertical, horizontal, below, transverse, row and column" as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A test information management device comprising:
   an input/output device to which first information and second information are input, the first information including identification information for identifying a first device and information representing an output state of a test signal output from the first device, the second information including image information representing the identification information and a value of the test signal from the first device;
   an analyzer configured to obtain the value of the test signal and the identification information from the image information included in the second information; and
   a linker configured to link together the first information and the second information which are input to the input/output device using the identification information obtained by the analyzer,
   wherein the input/output device is configured to output the first information and the second information linked together by the linker.

2. The test information management device according to claim 1,
   wherein the first information further includes at least information indicating a level of the test signal and an output start time of the level.

3. The test information management device according to claim 1, further comprising:
   a communicator configured to perform communication with the first device; and
   a test executor configured to cause the first device to output the test signal by transmitting an output instruction of the test signal to the first device through the communicator.

4. The test information management device according to claim 3,
   wherein the communicator acquires the identification information from the first device.

5. The test information management device according to claim 1,
   wherein the first device is a field device.

6. The test information management device according to claim 1,
   wherein the first device is a device capable of outputting an operation signal for operating a field device as the test signal.

7. A test information management method comprising:
   inputting, to an input/output device, first information and second information, the first information including identification information for identifying a first device and information representing an output state of a test signal output from the first device, the second information including image information representing the identification information and a value of the test signal from the first device;

obtaining, by an analyzer, the value of the test signal and the identification information from the image information included in the second information;

linking, by a linker, together the first information and the second information which are input to the input/output device using the identification information obtained by the analyzer; and outputting, by the input/output device, the first information and the second information linked together by the linker.

8. The test information management method according to claim 7, wherein the first information further includes at least information indicating a level of the test signal and an output start time of the level.

9. The test information management method according to claim 7, further comprising:

performing, by a communicator, communication with the first device; and causing, by a test executor, the first device to output the test signal by transmitting an output instruction of the test signal to the first device through the communicator.

10. The test information management method according to claim 9, further comprising:

acquiring, by the communicator, the identification information from the first device.

11. The test information management method according to claim 7, wherein the first device is a field device.

12. A non-transitory computer readable storage medium storing one or more test information management programs configured for execution by a computer of a test information management device, the one or more test information management programs comprising instructions for:

inputting, to an input/output device, first information and second information, the first information including identification information for identifying a first device and information representing an output state of a test signal output from the first device, the second information including image information representing the identification information and a value of the test signal from the first device;

obtaining, by an analyzer, the value of the test signal and the identification information from the image information included in the second information;

linking, by a linker, together the first information and the second information which are input to the input/output device using the identification information obtained by the analyzer; and outputting, by the input/output device, the first information and the second information linked together by the linker.

* * * * *